United States Patent
Schmalz et al.

(10) Patent No.: US 6,744,260 B2
(45) Date of Patent: Jun. 1, 2004

(54) TESTER FOR A PLURALITY OF CIRCUIT BREAKERS HAVING A RANGE OF RATED CURRENTS AND MULTIPLE TRIP FUNCTIONS

(75) Inventors: Steven C. Schmalz, Greenfield, WI (US); Michael F. Walz, Bradenton, FL (US); James M. McCormick, Bradenton, FL (US)

(73) Assignee: Eaton Corporation, Cleveland, OH (US)

( * ) Notice: Subject to any disclaimer, the term of this patent is extended or adjusted under 35 U.S.C. 154(b) by 22 days.

(21) Appl. No.: 10/196,832

(22) Filed: Jul. 17, 2002

(65) Prior Publication Data

US 2004/0012393 A1 Jan. 22, 2004

(51) Int. Cl.⁷ ...................... H01H 31/02; G01R 31/327
(52) U.S. Cl. ........................................ 324/555; 324/424
(58) Field of Search ................................ 324/555, 500, 324/424, 415; 340/638; 361/42, 58, 102, 109, 114, 115

(56) References Cited

U.S. PATENT DOCUMENTS

| | | | | |
|---|---|---|---|---|
| 3,742,304 A | * | 6/1973 | Elder ........................... 361/198 |
| 4,028,536 A | * | 6/1977 | Woodward ................... 714/820 |
| 4,307,345 A | * | 12/1981 | Schoen ........................ 324/424 |
| 4,859,932 A | * | 8/1989 | Whitley ..................... 324/72.5 |
| 4,998,067 A | * | 3/1991 | Puckett et al. ............... 324/424 |
| 5,334,939 A | * | 8/1994 | Yarbrough .................. 324/424 |
| 5,459,630 A | | 10/1995 | MacKenzie et al. |
| 5,546,266 A | | 8/1996 | MacKenzie et al. |
| 5,642,052 A | | 6/1997 | Earle |
| 5,744,967 A | * | 4/1998 | Sorensen ..................... 324/540 |
| 6,072,317 A | | 6/2000 | MacKenzie |
| 6,084,756 A | | 7/2000 | Doring et al. |
| 6,128,169 A | | 10/2000 | Neiger et al. |
| 6,218,844 B1 | | 4/2001 | Wong et al. |
| 6,262,871 B1 | | 7/2001 | Nemir et al. |
| 6,263,294 B1 | * | 7/2001 | Frederickson et al. ....... 702/117 |
| 2001/0014959 A1 | * | 8/2001 | Whetsel ...................... 714/724 |

* cited by examiner

Primary Examiner—Andrew H. Hirshfeld
Assistant Examiner—Hoai-An D. Nguyen
(74) Attorney, Agent, or Firm—Marvin L. Union

(57) ABSTRACT

A tester for in situ testing of a plurality of circuit breakers having a range of rated currents and multiple trip functions, includes a plurality of power resistors of known impedance, an electronic switch associated with each power resistor connecting the resistor in series with the load terminal of the circuit breaker under test, and a controller that turns on a number of the switches selected to collectively draw through the associated power resistors a test current that is a function of the rated current and sufficient to trip the circuit breaker within a selected time window. Turn on of the electronic switches is also controlled to generate a current waveform appropriate for the trip function being tested. In a self test mode, the value of each of the power resistors is verified as being within limits.

14 Claims, 8 Drawing Sheets

TESTER FOR A PLURALITY OF CIRCUIT BREAKERS HAVING A RANGE OF RATED CURRENTS AND MULTIPLE TRIP FUNCTIONS

BACKGROUND OF THE INVENTION

1. Field of the Invention

This invention relates to equipment for testing in situ the trip functions of circuit breakers which may have a range of rated currents and more than one trip function.

2. Background Information

Circuit breakers in some applications are tested periodically to assure reliability. This is particularly so in aircraft electrical systems. It is preferable that the circuit breakers be tested in their installed state. The job is made more difficult by the high density of these very small circuit breakers and the fact in any one aircraft system, the breakers can have a range of current ratings. Furthermore, aircraft circuit breakers are now being offered with multiple trip functions.

There is a need for an improved circuit breaker tester that is portable for use in situ testing of circuit breakers, and particularly, installations with circuit breakers having a range of current ratings and even multiple protection functions.

SUMMARY OF THE INVENTION

This need and others are satisfied by the invention which is directed to a tester for testing a plurality of circuit breakers each having a designated rated current within a range of rated currents. The tester includes a plurality of load elements each having a known fixed impedance. An electronic switch associated with each load element when turned on connects the associated load element in series with the load terminal of a circuit breaker under test and in parallel with any other load elements connected in series with the load element. A controller turns on a number of the electronic switches selected to collectively draw through the associated load elements a combined test current selected as a function of the designated load current for the circuit breaker under test and sufficient to trip the circuit breaker. The controller turns on the electronic switches in a pattern that draws current through the circuit breaker under test at an amplitude appropriate for the rated current of that circuit breaker and with a waveform appropriate for the protection function being tested. For example, for testing circuit breakers having a delayed trip function and an arc fault function, the controller turns on a first number of the electronic switches for the delayed trip function and a second number of the electronic switches for the arc fault protection function thereby providing separate reference values for the two different trip functions. For circuit breakers in ac electrical systems, the controller can turn on the appropriate number of electronic switches on just some half cycles to test the arc fault protection function, for instance, in the case where the circuit breaker detects arc faults by recognizing gaps in current due to the arcing. In a preferred embodiment of the invention, the controller includes a full wave rectifier so that the current through the load elements is dc. In this case, a zero crossing detector synchronizes turning on of the electronic switches with half cycles of the ac.

The controller includes an indicator means indicating the results of the test. Preferably, the controller includes a power supply connected to the line terminal of the circuit breaker under test so that the indicator is an electrically energized indicator which will operate even with the circuit breaker tripped. The controller also monitors the voltage on the load terminal and includes an arming means which is only activated when the voltage on the load terminal is not substantially zero, indicating that the circuit breaker to be tested is closed.

The controller includes means for indicating test failure if the circuit breaker under test does not trip within a selected time window, beginning a predetermined time after the test is initiated. This includes means indicating failure when the voltage on the load terminal of the circuit breaker under test goes to substantially zero before the selected time window opens or the voltage on the load terminal remains sufficient to indicate that the circuit breaker is still closed after the selected time window closes.

The controller also has a test mode for testing the tester. This includes means testing the impedance of the load elements. The self-testing means includes means checking that the voltage on the load terminal of the circuit breaker under test is not substantially zero, means sequentially turning on one electronic switch at a time, and means checking that the voltage across the associated load element remains within a selected range.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
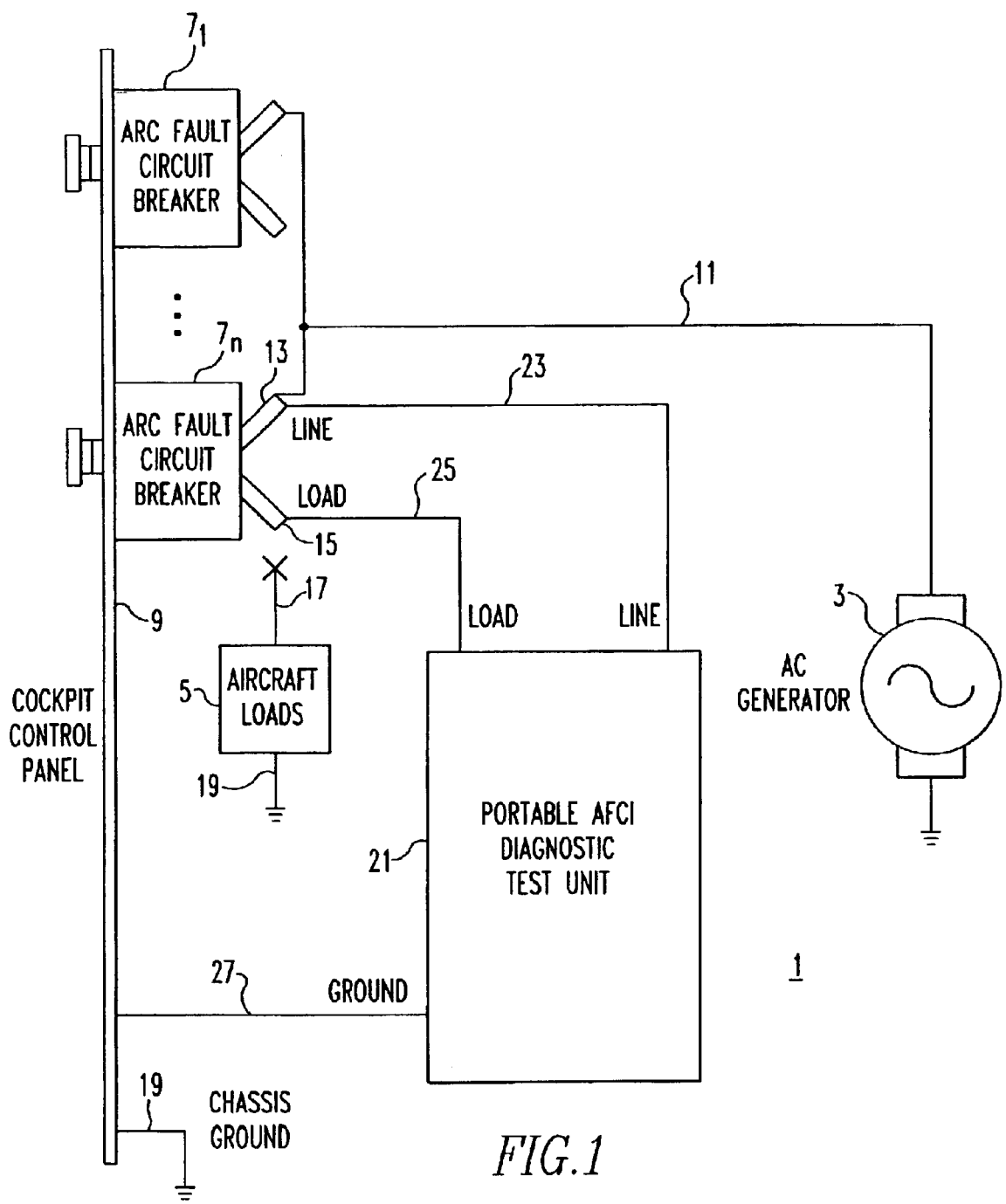
FIG. 1 is a schematic diagram of a tester in accordance with the invention connected for testing a circuit breaker in an aircraft electrical system.

The invention will be described as applied to the testing of circuit breakers in an aircraft electrical system. The aircraft electrical system 1 includes an ac generator 3 that provides electrical power to aircraft loads 5 through a plurality of circuit breakers $7_1$-$7_n$ mounted in a cockpit control panel 9. The line conductor 11 from the ac generator 3 is connected to the line terminal 13 on each of the circuit breakers. The aircraft loads 5 are connected to the load terminals 15 of the circuit breakers by load conductors 17 (only one shown). The aircraft frame forms the ground 19.

The circuit breakers $7_1$-$7_n$ provide multiple protection functions, namely: thermal protection, short delay protection, and arc fault protection. The thermal trip responds to persistent overload currents. The short delay responds to higher level currents of short duration. Arc fault protection responds to characteristic patterns of current produced by arcing. For instance, the random intermittent nature of arc fault currents.

In order to test the protection functions of the circuit breakers $7_1$-$7_n$, the portable tester 21 is provided. It is desirable that due to the large number of circuit breakers $7_1$-$7_n$ in an aircraft electrical system, and the need to maximize in service time of the aircraft, it is desirable that the circuit breakers be tested in situ. Accordingly, the tester 21 includes a line lead 23 and a load lead 25 that can be connected directly to the line terminal 13 and load terminal 15 of a circuit breaker under test. During test, the load conductor 17 is disconnected from the load terminal 15, as shown in FIG. 1 by the "X". A ground lead 27 is connected between the control panel 9 and the tester 21. The tester 21 is powered by the ac electrical system through the line lead 23 connected to the line terminal 13 and the ground lead 27. Thus, the tester 21 does not require a battery. The tester 21 can be housed in a suitcase-like enclosure (not shown) for portability.

Figure 2:
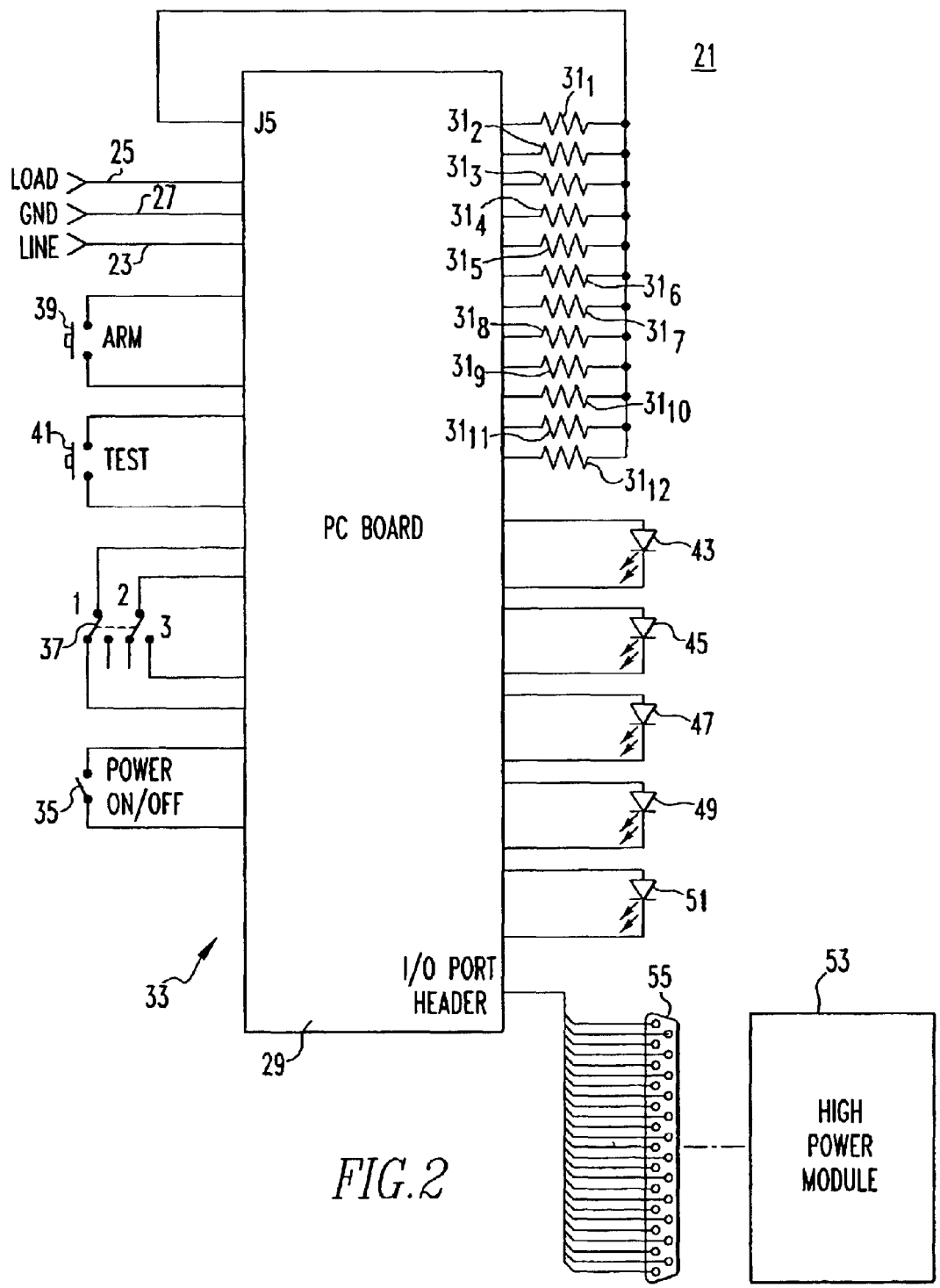
FIG. 2 is a schematic diagram showing relevant components connected to the printed circuit board which forms part of the tester of FIG. 1.

Turning to FIG. 2, the tester 21 includes a printed circuit board 29 which is described in more detail in connection with FIG. 3. Connected to this printed circuit board 29 are a plurality of load elements in the form of power resistors $31_1$-$31_{12}$, each having a known impedance. In the exemplary tester, the impedances of all the power resistors $31_1$-$31_{12}$ are the same, although they need not be. The tester 21 also includes a controller 33 mounted on the pc board 29, but including a number of switches and indicators off the board as shown in FIG. 2. These include, a power switch 35, a test selector switch 37, an arm pushbutton 39, and a test pushbutton 41. The test selector switch 37 is a double pole three-position switch having one position for the thermal trip test, a second position for the delay trip test, and a third position for the arc fault test. The indicators are a number of light emitting diodes (LEDs) including a yellow "check breaker" LED 43, a green "ready" LED 45, a green "pass" LED 47, a red "fail" LED 49, and a green "power" LED 51. The function of these LEDs will become apparent as the operation of the tester is described.

The power resistors $31_1$-$31_{12}$ are used for testing the delayed trip and arc fault trip functions. Due to power dissipation requirements for thermal overload testing, a separate, high-power, less portable module 53 containing high power output stages and load resistors is connected to the pc board 29 through the connector 55.

Figure 3A:
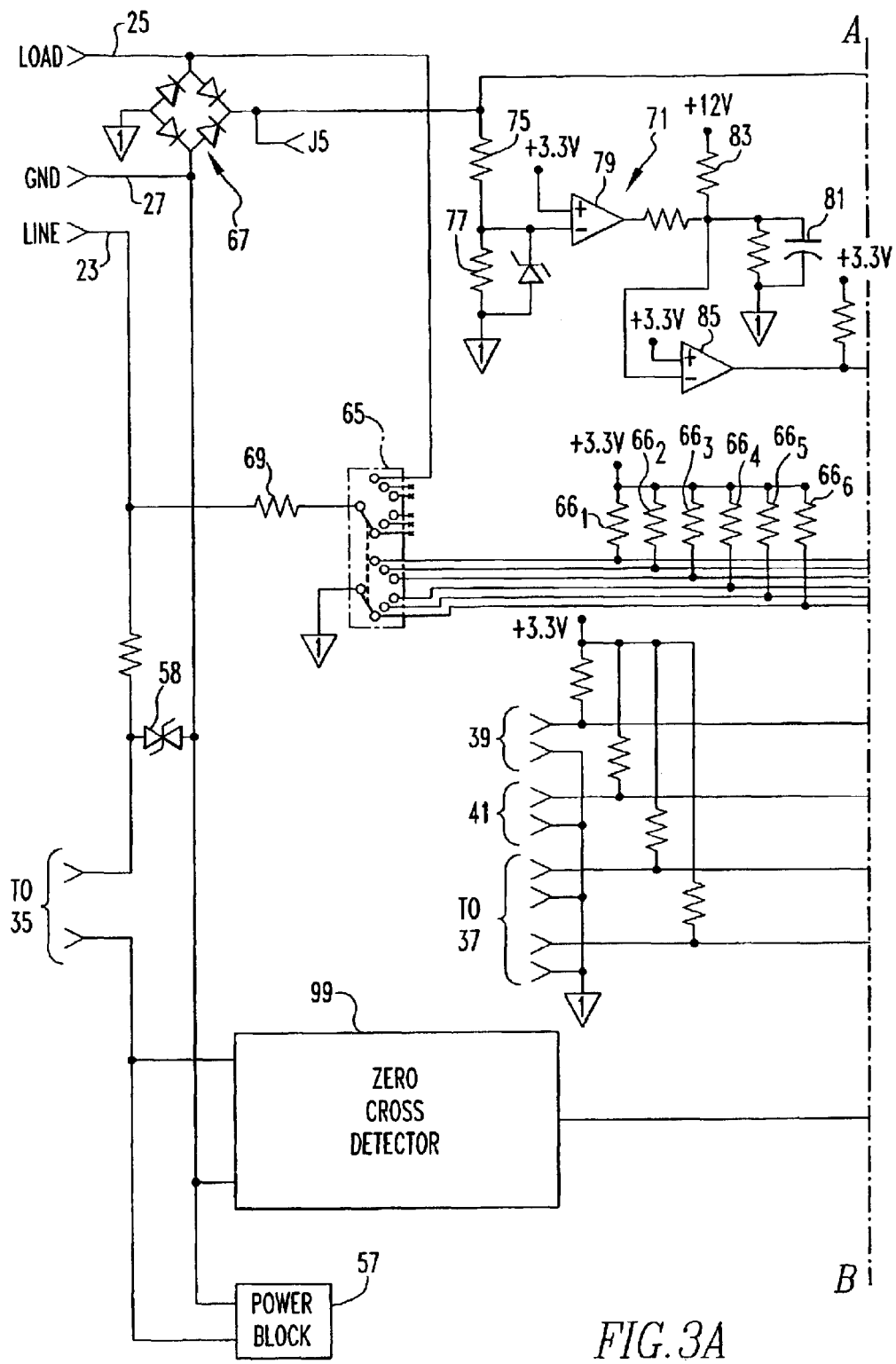
FIGS. 3A, 3B and 3C when placed side by side illustrate a schematic circuit diagram of the printed circuit board of FIG. 2.
Figure 3B:
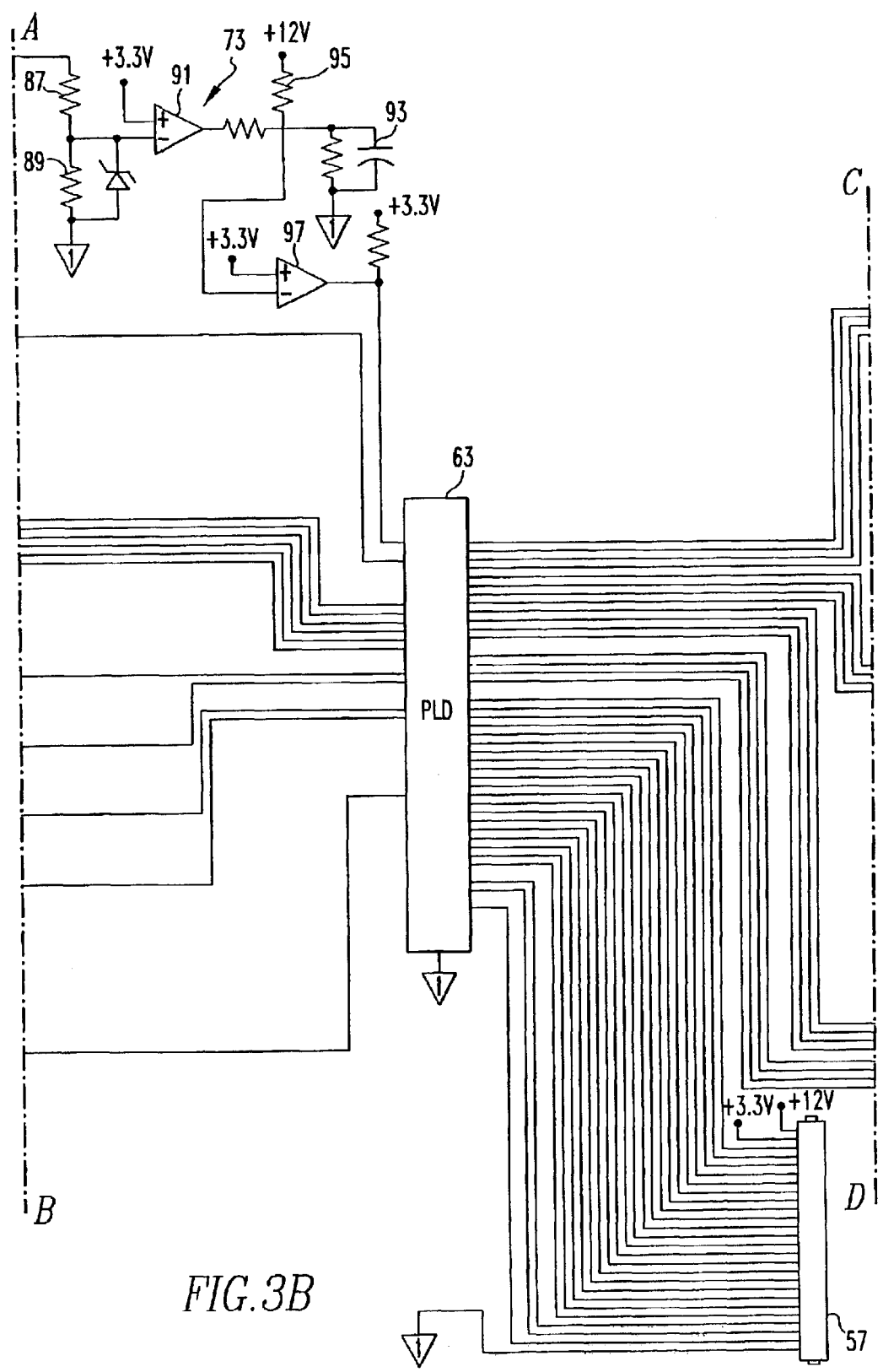
Figure 3C:
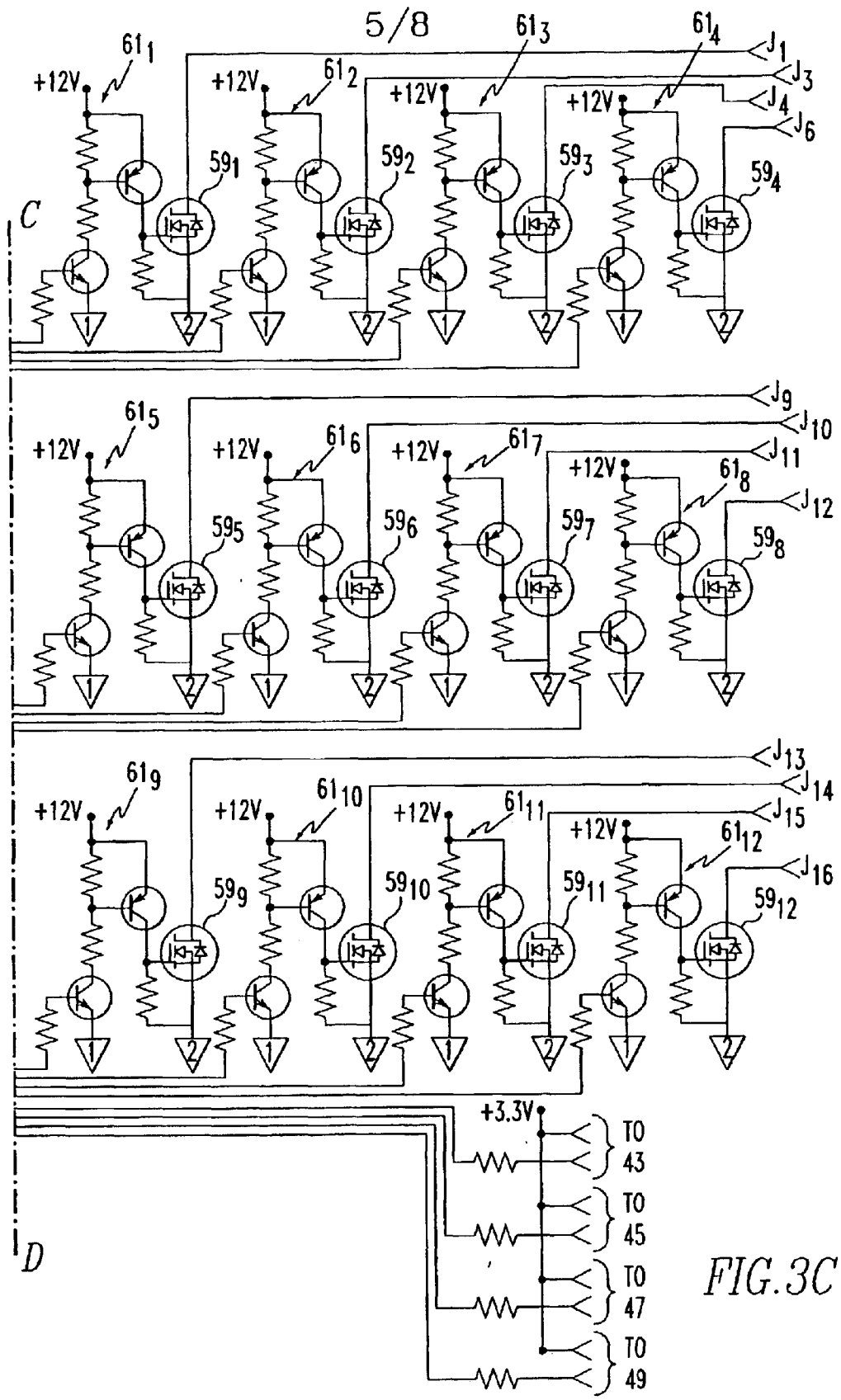

A schematic diagram of the pc board 29 is illustrated in FIGS. 3A, 3B and 3C. The power switch 35 connects a power block 57 to the line and ground leads 23 and 27, respectively. The power block 57 provides +12V and +3V power to the pc board, including the "power" LED 51 directly (not shown). A transient load protector 58 protects the power block from overvoltages.

Mounted on the pc board 29 are a plurality of electronic switches $59_1$-$59_{12}$ each associated with a correspondingly identified one of the power resistors $31_1$-$31_{12}$. The particular electronic switches $59_1$-$59_{12}$ are MOSFETs, each of which has a driver $61_1$-$61_{12}$. The controller 33 includes a programmable logic device (PLD) 63 which individually controls the drivers $61_1$-$61_{12}$ to selectively turn on the electronic switches $59_1$-$59_{12}$. Inputs to the PLD 63 include the test selector switch 37, the arm pushbutton 39 and the test pushbutton 41. In addition, a six-position rotary breaker rating selector switch 65 is set to provide the rated current for the circuit breaker under test to the PLD 63. Six pull-down resistors $66_1$-$66_6$ provide digital inputs to the PLD which can be programmed for the desired range of rated currents for the circuit breakers being tested. The digital input determines the number of switches to be turned on and therefore the number of power resistors to be connected in parallel for the corresponding rated current. The sixth position of the selector switch provides a digital input for the self-test mode in which each power resistor is tested separately.

A bridge circuit 67 full wave rectifies the voltage appearing on the load terminal of the circuit breaker under test. The full wave rectified voltage is applied to all of the power resistors $31_1$-$31_{12}$ through the common terminal J5. When the rating selector switch 65 is in the test position, a resistor 69 serves as a pull up resistance, providing a current path in place of a circuit breaker under test for testing the impedances of the power resistors $31_1$-$31_{12}$. The rectified voltage provided by the bridge circuit 67 is also applied to a breaker trip/resistor low detect circuit 71 and a resistor high detect circuit 73. The breaker trip/resistor low detect circuit 71 includes a voltage divider formed by the resistors 75 and 77 which apply a voltage proportional to the load terminal voltage to a comparator 79. If the load voltage falls below a reference value indicating that the circuit breaker under test is not closed, the output of the comparator 79 goes high allowing a capacitor 81 to charge through a resistor 83. When this occurs, the output of comparator 85 goes low signaling the PLD 63 that the circuit breaker is open. Also, during self test, each of the resistors is connected to the output of the bridge circuit 67 individually. If the resistance of any resistor has gone too low, thus pulling the load terminal voltage down, the output of comparator 85 goes low to signal an out of tolerance resistor. The resistor high detect circuit 73 acts similarly, but the resistors 87 and 88 are selected so that as long as the voltage across a load resistor under test remains above a selected high value, the output of comparator 91 remains high, allowing capacitor 93 to charge through resistor 95, thereby keeping the output of comparator 97 which is input to the PLD low. When the resistance of a load resistor 31 under test is too high, the output of comparator 91 goes low to discharge the resistor 93 and the output of comparator 97 goes high to indicate to the PLD that the resistor is out of tolerance on the high side.

The controller 33 also includes on a printed circuit board 29 a zero crossing detector 99 that detects the zero crossings of the line to ground voltage. The square wave output of the zero crossing detector 99 is applied to the PLD 63 for synchronizing the turn on of the electronic switches $59_1$-$59_{12}$ to the line voltage.

Figure 4:
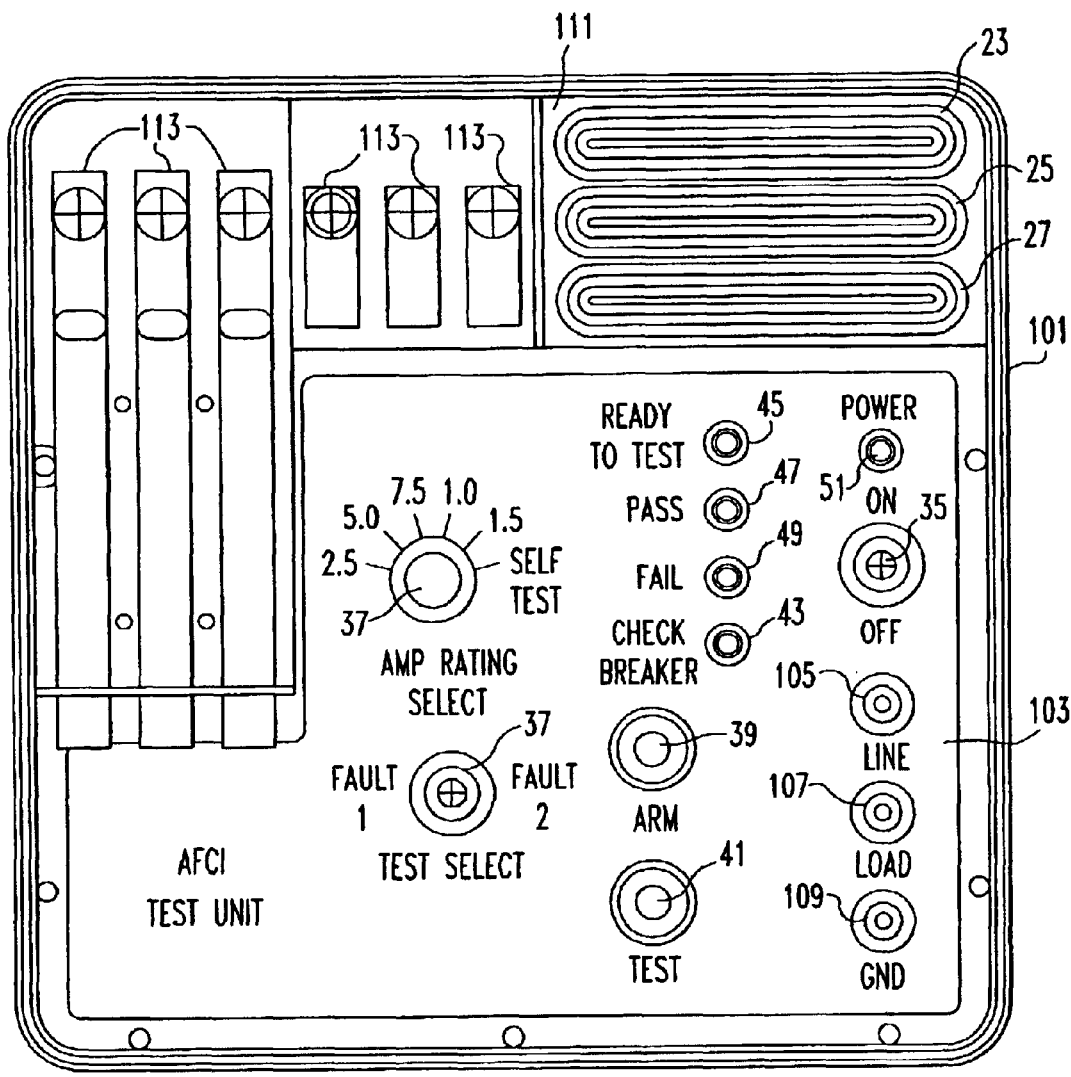
FIG. 4 is a plan view of the tester.

The tester 21 is enclosed for portability in a suitcase enclosure 101 as shown in FIG. 4 with the cover removed. The switches 35 and 37, pushbuttons 39 and 41 and LEDs 43,45,47,49 and 51 are all mounted in a front panel 103 which also includes plug in connectors 105,107 and 109 for the line, load and ground leads 23,25, and 27 which can be stored in a recess 111. Alligator clamps 113 for connecting the leads to the circuit breaker to be tested can also be stored in the enclosure 101.

Figure 5A:
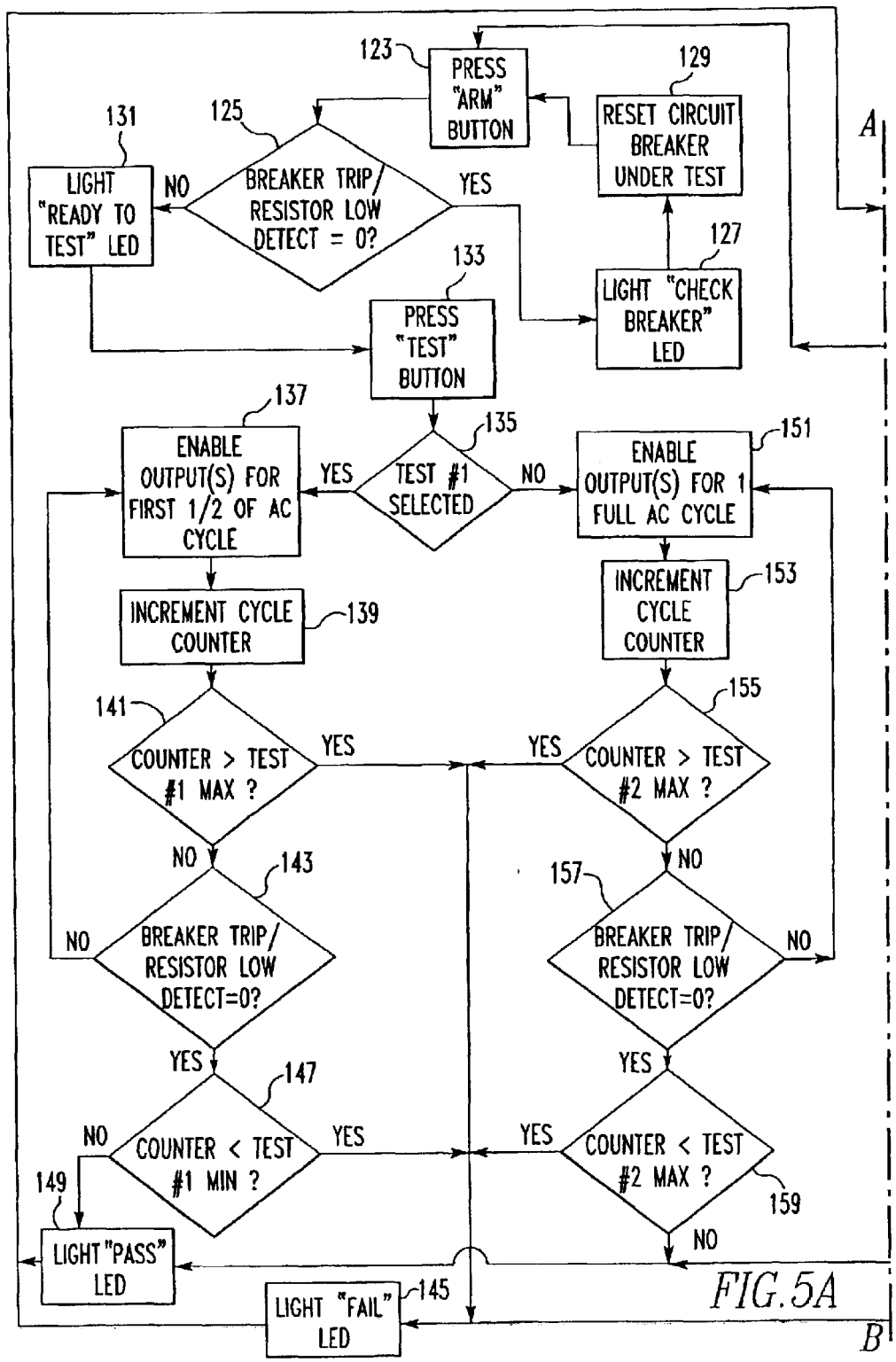
FIGS. 5A and 5B when placed side by side illustrate a logic/function flow chart for the tester.
Figure 5B:
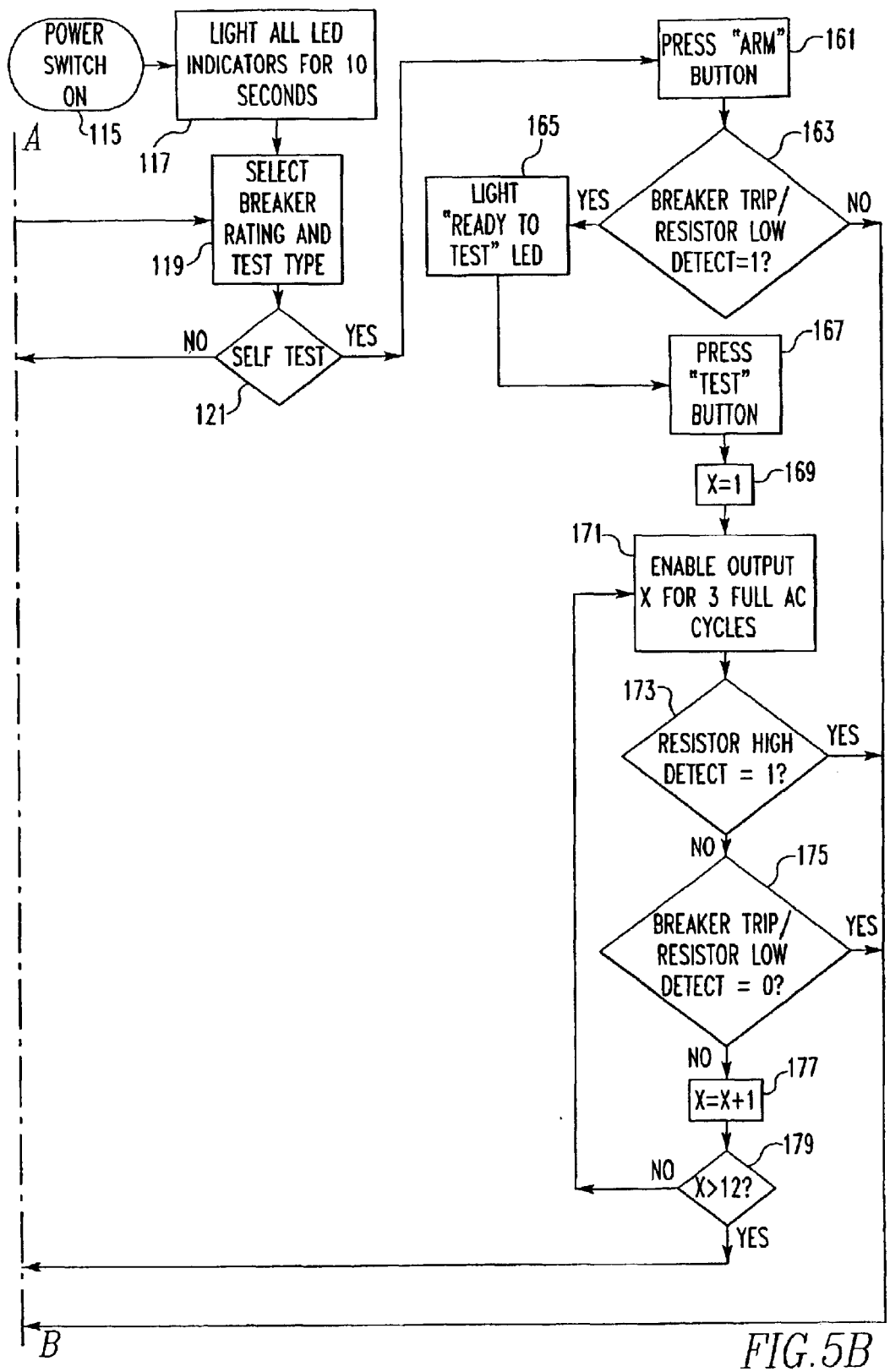

FIGS. 5A and 5B illustrate the logic functions of the tester 21. When the power switch 51 is turned on at 115 all of the LEDs light at 117 to test their operation. The operator then selects the breaker rating using the rating selector switch 65 and the test type using the test selector switch 37, as indicated at 119. If the selector switch was not set for self test as determined at 121, normal testing is commenced by pressing the arm button 39, as indicated at 123. If the breaker trip/resistor load detector detects a voltage on the load resistor of substantially zero at 125 indicating that the circuit breaker under test is open, the "check breaker" LED 43 is illuminated at 127. This prompts the operator to reset the circuit breaker under test at 129. If sufficient voltage is detected on the load terminal at 125 to indicate that the circuit breaker under test is closed, the "ready to test" LED 45 illuminates at 131. The operator then actuates the test button at 133. If the test selector switch was set to Test #1, which is the arc fault test, as determined at 135, the PLD enables the appropriate number of outputs previously determined by the setting of the breaker rating for the first half of an ac cycle as indicated at 137. As previously mentioned, the breaker under test should trip during a predetermined time window after test initiation. This timing is implemented by a cycle counter at 139. As long as the counter has not reached the maximum for Test #1, which would be the closing of the window, at 141, the terminal voltage on the circuit breaker under test is checked at 143 by checking the breaker trip/resistor low detector output to determine if the breaker has tripped. If the breaker has not tripped, as determined at 143, the outputs are enabled for another half cycle at 137 and the cycle counter is again incremented at 139. If the counter exceeds the Test #1 maximum value at 141, meaning that the circuit breaker did not trip within the desired window, the "fail" LED 49 is illuminated at 145.

If, on the other hand, a breaker trip is detected at 143 before the window has closed at 141, the counter is checked at 147 to see if the trip occurred within the timing window. If it occurred too soon, the "fail" LED is also turn on at 145. If the trip occurred within the timing window, the "pass" LED is illuminated at 149. By only enabling the outputs to connect the required number of power resistors to the load terminal on the first half of the ac cycles under Test #1, the tester generates gaps in the load current waveform that can be recognized by the arc fault circuitry in the circuit breaker under test.

When Test #2 is detected as having been selected at 135, the PLD enables the number of outputs determined by the setting of the breaker rating switch for the full ac cycle at 151. The cycle counter is then incremented at 153 and the count is checked at 155. The timing window for the short delay trip of Test #2 will most likely be longer than the window for the arc fault test for that circuit breaker. If the circuit breaker has not tripped as determined at 157, the appropriate number of outputs are enabled for another full cycle at 151. As in the case of the arc fault test, if the circuit breaker has not tripped by the time that the window for the short delay trip has closed at 155, the "fail" LED 49 is illuminated at 145. Also, if the circuit breaker responds to the short delay trip test current before the window opens as determined at 159, the "fail" LED is turned on at 145. Only if the circuit breaker opens during the window for the short delay trip function will the "pass" LED 47 be turned on at 149.

With self test selected as determined at 121, the operator presses the "arm" button 39 at 161. The breaker trip/resistor low detector is then checked at 163 to assure that there is sufficient voltage to perform the self test. This voltage is provided by the resistor 69 connected across the line and load conductors with the test selector switch 65 in the self test position. If there is insufficient voltage, the "fail" LED 49 is illuminated at 145. However, when there is sufficient voltage, the "ready to test" LED 45 is illuminated at 165. The operator then presses the "test" button 41 at 167. A counter "X" for counting the power resistors is set to 1 at 169. The PLD then enables the output turning on the electronic switch associated with the power resistor determined by "X" for three full ac cycles as indicated at 171. The resistor high detector and the breaker trip/resistor low detector are then sequentially checked at 173 and 175 to determined if the value of the power resistor under test is within limits. If the resistor value is too high as determined at 173, or too low as determined at 175, the "fail" LED 49 is turned on at 145. Otherwise the counter "X" is incremented at 177 and the test is repeated for each of the other power resistors. When it is determined at 179 that all of the power resistors are within limits, the "pass" LED 47 is turned on at 149.

For testing a thermal trip function where greater energy dissipation is required, a plurality of additional higher power resistors and their associated electronic switches with drivers, similar to the switches 59, can be provided on the high power module 53. The PLD 63 performs similar functions in turning on the appropriate number of switches for the current rating of the circuit breaker under test and looks for tripping of the circuit breaker within a window appropriate for the thermal trip function. Again, the test would result in either a "pass" or "fail" LED being illuminated.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A tester for testing a plurality of circuit breakers each having a line terminal, a load terminal and a designated rated current within a range of rated currents, the tester comprising:
   a plurality of load elements each having known fixed impedance;
   an electronic switch associated with each load element connecting when turned on the associated load element in series with the load terminal of one of the plurality of circuit breakers under test and in parallel with any other load elements connected in series with the load terminal; and
   a controller for turning on a number of the electronic switches selected to collectively draw through the associated load elements a combined test current selected as a function of the designated rated current for the circuit breaker under test and sufficient to trip the circuit breaker under test open.

2. The tester of claim 1 wherein the controller has indicator means providing an indication of test results.

3. The tester of claim 2 wherein the controller has a power circuit connected to the line terminal of the circuit breaker under test and the indicator means comprises an electrically energized indicator.

4. The tester of claim 3 wherein the controller has arming means responsive to voltage on the load terminal of the circuit breaker under test and wherein the indicator means provides an indication that the tester is not ready to perform a test when the voltage on the load terminal is substantially zero.

5. The tester of claim 1 wherein the controller has means confirming that the load terminal of the circuit breaker under test has sufficient voltage to indicate that the circuit breaker under test is closed prior to turning on any of the electronic switches.

6. The tester of claim 1 adapted for the plurality of circuit breakers having delayed trip and arc fault protection functions for ac systems, and wherein the controller includes means turning on the electronic switches for every half cycle to test the delayed trip protection function, and means turning on the electronic switches on for less than every half cycle to test the arc fault detection function.

7. The tester of claim 6 wherein the means turning on the number of electronic switches turns on the number of electronic switches only on half cycles of one plurality for testing the arc fault protection functions.

8. The tester of claim 6 wherein the controller includes a fullwave rectifier rectifying current drawn by the load elements and a zero crossing detector to synchronize turning on of the electronic switches with the ac half cycles.

9. The tester of claim 1 adapted for the plurality of circuit breakers having delayed trip and arc fault protection functions wherein the controller includes means turning on a first number of electronic switches for testing the delayed trip protection function of a circuit breaker of a test and a second number of the electronic switches for testing the arc fault protection function of that same circuit breaker.

10. The tester of claim 1 adapted for the plurality of circuit breakers having delayed trip and arc fault protection functions wherein the controller comprises means indicating test failure when the circuit breaker under test does not trip within a selected time window beginning a predetermined time after testing initiation.

11. The tester of claim 10 wherein the means indicating test failure comprises means responsive to the voltage on the load terminal of the circuit breaker under test going to substantially zero before the selected time window opens and means responsive to voltage of the load terminal of the circuit breaker under test remaining sufficient to indicate that the circuit breaker under test is still closed after the selected time window closes.

12. The tester of claim 11 wherein the controller includes a power circuit energized from the line terminal of the circuit breaker under test and means indicating test failure is electrically energized from the line terminal of the circuit breaker under test.

13. The tester of claim 1 wherein the controller has a test mode and includes test means testing the impedance of the load elements.

14. The tester of claim 13 wherein the test means includes means confirming that voltage on the load terminal of the circuit breaker under test is not substantially zero, means sequentially turning on one electronic switch at a time to place the associated load element in series with the load terminal of the circuit breaker under test and means checking that the voltage across the associated load element remains within a selected range.

* * * * *